United States Patent
Shin

(10) Patent No.: US 7,851,706 B2
(45) Date of Patent: Dec. 14, 2010

(54) FLEXIBLE PRINTED CIRCUIT AND MANUFACTURING METHOD THEREOF

(75) Inventor: Sang-chul Shin, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1258 days.

(21) Appl. No.: 11/416,137

(22) Filed: May 3, 2006

(65) Prior Publication Data

US 2007/0026726 A1    Feb. 1, 2007

(30) Foreign Application Priority Data

Aug. 1, 2005    (KR) .................. 10-2005-0070264

(51) Int. Cl.
*H05K 1/00*    (2006.01)
(52) U.S. Cl. ...................... 174/254; 361/749
(58) Field of Classification Search ................ 174/254; 361/748–751
See application file for complete search history.

(56) References Cited

U.S. PATENT DOCUMENTS

| 3,512,946 A | 5/1970 | Hutkin |
| 5,615,088 A * | 3/1997 | Mizumo ..................... 361/749 |
| 6,015,607 A | 1/2000 | Fraivillig |
| 2003/0116343 A1 | 6/2003 | Adachi et al. |
| 2004/0124003 A1 | 7/2004 | Ryu et al. |

FOREIGN PATENT DOCUMENTS

| EP | 0 386 459 | 9/1990 |
| EP | 0 425 677 | 5/1991 |
| EP | 0 533 198 | 3/1993 |
| EP | 1 262 509 | 12/2002 |
| JP | 04-027188 | 1/1992 |
| JP | 09-102656 | 4/1997 |
| JP | 09251813 | 9/1997 |
| JP | 2000-133901 | 5/2000 |
| JP | 2004-335807 | 11/2004 |

OTHER PUBLICATIONS

European Search Report dated Sep. 29, 2006.

* cited by examiner

*Primary Examiner*—Jeremy C Norris
(74) *Attorney, Agent, or Firm*—Staas & Halsey LLP

(57) ABSTRACT

A flexible printed circuit including an interior insulation layer, a first conductive layer formed on a surface of the interior insulation layer in a circuit pattern, a first exterior insulation layer deposited to cover the surface of the interior insulation layer and the first conductive layer, a second conductive layer formed on the other surface of the interior insulation layer in a circuit pattern, and a second exterior insulation layer deposited to cover the other surface of the interior insulation layer and the second conductive layer. The flexible printed circuit is manufactured by depositing an interior insulation layer on a base layer, forming a first conductive layer on a surface of the interior insulation layer in a circuit pattern, depositing a first exterior insulation layer to cover the surface of the interior insulation layer and the first conductive layer, removing the base layer, forming a second conductive layer on another surface of the interior insulation layer in a circuit pattern, and depositing a second exterior insulation layer to cover the another surface of the interior insulation layer and the second conductive layer.

15 Claims, 7 Drawing Sheets

FLEXIBLE PRINTED CIRCUIT AND MANUFACTURING METHOD THEREOF

CROSS-REFERENCE TO RELATED APPLICATION

This application claims the benefit of Korean Patent Application No. 10-2005-0070264, filed on Aug. 1, 2005, in the Korean Intellectual Property Office, the disclosure of which is incorporated herein by reference.

BACKGROUND OF THE INVENTION

1. Field of the Invention

The present invention relates to a flexible printed circuit and a method of manufacturing the same, and more particularly, to a double-sided flexible printed circuit which can be used as a signal transfer route in a compact hard disk drive, and a method of manufacturing the same.

2. Description of Related Art

Hard disk drives (HDDs) are information storage devices for personal computers. With the continuous miniaturization of HDDs, they are increasingly used as information storage devices for portable electronic devices such as mobile phones or MP3 players.

FIG. 1 is a perspective view of a conventional compact HDD. Referring to FIG. 1, a conventional compact HDD 10 includes a base member 11 and a cover member 12 coupled to the base member 11. A spindle motor 15 to rotate a disk 13 and an actuator 17 to move a magnetic head (not shown) to a desired position on the disk 13 are installed on the base member 11.

The actuator 17 includes a swing arm 18 rotatably coupled to the base member 11 and a suspension 19 installed at one end portion of the swing arm 18 and supporting a head slider 20 with the magnetic head mounted thereon to be elastically biased toward the surface of the disk 13. The actuator 17 has a voice coil motor (VCM) 22 to rotate the swing arm 18. The voice coil motor 22 includes a VCM coil 23 coupled to the other end portion of the swing arm 18 and a magnet 24 installed on the base member 11 to face the VCM coil 23. The voice coil motor 22 is controlled by a servo control system and rotates the swing arm 18 in a direction according to the Fleming's left hand rule by the interaction of current input to the VCM coil 23 and a magnetic field formed by the magnet 24.

A printed circuit board (not shown) is arranged on the bottom surface of the base member 11. Semiconductor chips and other circuit devices (not shown) to operate the actuator 17, the magnetic head, and spindle motor 15 are mounted on the printed circuit board. The printed circuit board and the actuator 17 are connected by a flexible printed circuit 30.

FIG. 2 is a cross-sectional view taken along line II-II of FIG. 1. Referring to FIG. 2, the flexible printed circuit 30 includes a conductive layer 35 formed of copper (Cu) into a circuit pattern and provided between first and second insulation layers 31 and 32 formed of polyimide. The conductive layer 35 is attached to the first insulation layer 31 via an adhesive layer 36 and the second insulation layer 32 is attached to the conductive layer 35 and the first insulation layer 31 via another adhesive layer 37.

The conventional flexible printed circuit 30 has a problem in that, as the first and second insulation layers 31 and 32 are formed of a polyimide film exhibiting a relatively large stiffness, a large amount of electric power is needed for the rotation of the actuator 17 because the stiffness of the flexible printed circuit 30 increases. Also, since the viscosity of the first and second adhesive layers 36 and 37 changes greatly according to a change in temperature, the stiffness of the flexible printed circuit 30 changes greatly according to the change in temperature. As a result, the rotation control of the actuator 17 becomes difficult so that information processing speed of the hard disk drive 10 decreases.

A plurality of circuit patterns are formed on the conductive layer 35 of the flexible printed circuit 30. A width Wp of each circuit pattern and a gap G between adjacent circuit patterns must be maintained over tens of micrometers to secure the reliability in signal transfer. Accordingly, the width Wa of the entire flexible printed circuit 30 increases so that miniaturization of the compact HDD 10 is difficult.

BRIEF SUMMARY

An aspect of the present invention provides a flexible printed circuit in which a conductive layer has a double layer structure and adjacent layers are coupled without using an adhesive, and a method of manufacturing the same.

According to an aspect of the present invention, a flexible printed circuit includes an interior insulation layer, a first conductive layer formed on a surface of the interior insulation layer in a circuit pattern, a first exterior insulation layer deposited to cover the surface of the interior insulation layer and the first conductive layer, a second conductive layer formed on the other surface of the interior insulation layer in a circuit pattern, and a second exterior insulation layer deposited to cover the other surface of the interior insulation layer and the second conductive layer.

No adhesive layer may be provided between adjacent layers. The insulation layer may be formed of photoresist polyimide. The insulation layers are formed by deposition. The conductive layers are formed of copper or a copper alloy.

The conductive layers may be formed by plating or deposition. The interior insulation layer may have a double layer structure including a first interior insulation layer and a second interior insulation layer and an electromagnetic shield layer may be between the first and second interior insulation layers.

The electromagnetic shield layer may include low carbon steel as an electromagnetic shield material. The electromagnetic shield layer may include aluminum (Al), or an alloy of aluminum (Al) and iron (Fe) as an electromagnetic shield material.

The electromagnetic shield layer may be formed by pasting a mixture of electromagnetic shield material powder and pigment. The electromagnetic shield layer may be formed by deposition. The electromagnetic shield layer may be formed between selected parts of circuit patterns of the first and second conductive layers.

The flexible printed circuit may further comprise a connecting pad which is formed by partially removing the first and second exterior insulation layers to expose the conductive layers so as to be connectable to other circuit device.

According to another aspect of the present invention, a method of manufacturing a flexible printed circuit includes depositing an interior insulation layer on a base layer, forming a first conductive layer on a surface of the interior insulation layer in a circuit pattern, depositing a first exterior insulation layer to cover the surface of the interior insulation layer and the first conductive layer, removing the base layer, forming a second conductive layer on another surface of the interior insulation layer in a circuit pattern, and depositing a second exterior insulation layer to cover the another surface of the interior insulation layer and the second conductive layer.

The base layer may be formed of a metal thin plate and, in the removing of the base layer, the base layer being removed by etching.

The forming of the first and second conductive layers may include forming a photoresist layer to provide a groove corresponding to a circuit pattern on the interior insulation layer, depositing the conductive layers on the groove, and removing the photoresist layer.

The deposition of the conductive layers may be performed by plating or deposition. The conductive layers may be formed of copper or a copper alloy. There may be no forming of an adhesive layer between adjacent arbitrary layers. The insulation layers may be formed of photoresist polyimide.

A desired particular portion of each of the insulation layers may be removed by masking, photo exposure, and developing. The insulation layers may be formed by deposition. The method may further include forming a nickel (Ni) plated layer on the conductive layers to prevent oxidation of the conductive layers.

The method may further include, after removing the base layer and before forming the second conductive layer, forming an electromagnetic shield layer on the other surface of the interior insulation layer, and depositing one more interior insulation layer to cover the electromagnetic shield layer.

The electromagnetic shield layer may include low carbon steel as an electromagnetic shield material. The electromagnetic shield layer may include aluminum (Al), or an alloy of aluminum (Al) and iron (Fe) as an electromagnetic shield material. The electromagnetic shield layer may be formed by pasting a mixture of electromagnetic shield material powder and pigment.

The electromagnetic shield layer may be formed by deposition. The electromagnetic shield layer may be formed between selected parts of circuit patterns of the first and second conductive layers.

The method may further include a connecting pad which is formed by partially removing the first and second exterior insulation layers to expose the conductive layers so as to be connectable to other circuit device.

According to another aspect of the present invention, a flexible printed circuit includes an interior insulation layer including a first interior insulation layer and a second interior insulation layer and an electromagnetic shield layer therebetween, a first conductive layer formed on a surface of the first interior insulation layer in a circuit pattern, a first exterior insulation layer covering the first interior insulation layer and the first conductive layer, a second conductive layer formed on a surface of the second interior insulation layer in a circuit pattern, and a second exterior insulation layer covering the second interior insulation layer and the second conductive layer.

The electromagnetic shield layer may be formed between only some of the circuit patterns of the first and second conductive layers. The some circuit patterns may include two pairs of circuit lines transmitting write signals to a magnetic head, and two pairs of circuit lines transmitting read signals from the magnetic head.

Additional and/or other aspects and advantages of the present invention will be set forth in part in the description which follows and, in part, will be obvious from the description, or may be learned by practice of the invention.

BRIEF DESCRIPTION OF THE DRAWINGS

The above and/or other aspects and advantages of the present invention will become apparent and more readily appreciated from the following detailed description, taken in conjunction with the accompanying drawings of which.

DETAILED DESCRIPTION OF EMBODIMENTS

Figure 1:
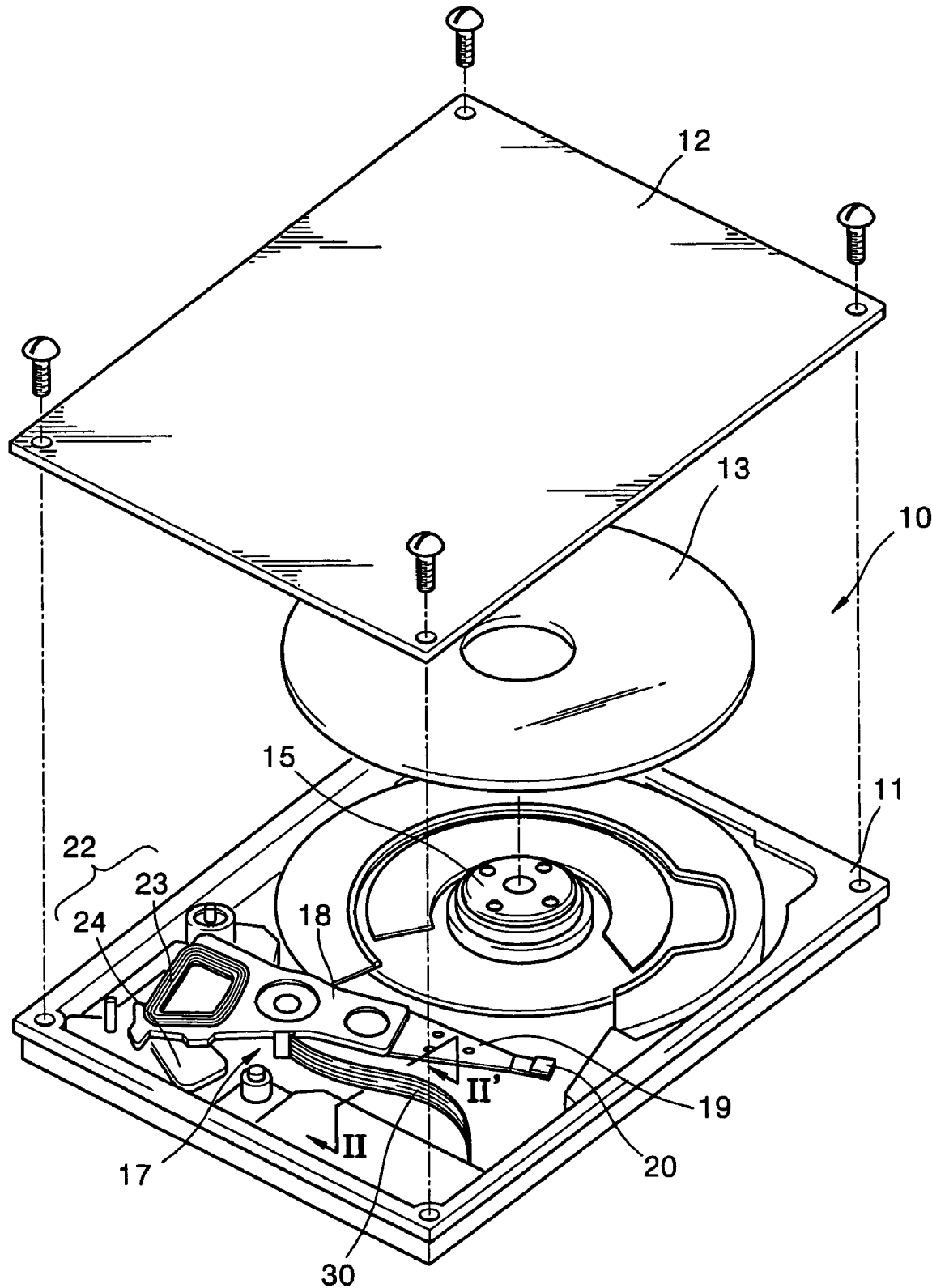
FIG. 1 is a perspective view of a conventional compact HDD.

Reference will now be made in detail to embodiments of the present invention, examples of which are illustrated in the accompanying drawings, wherein like reference numerals refer to the like elements throughout. The embodiments are described below in order to explain the present invention by referring to the figures.

Figure 3:
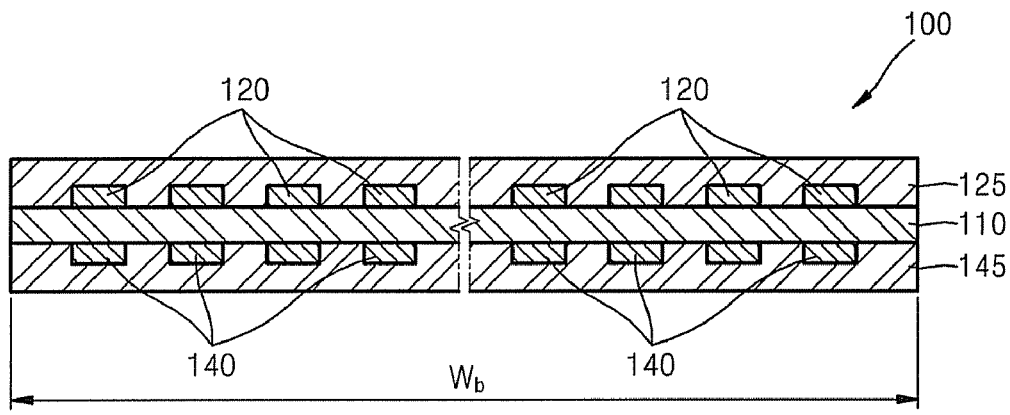
FIGS. 3 and 4 are cross-sectional views of flexible printed circuits according to embodiments of the present invention.

Referring to FIG. 3, a flexible printed circuit 100 according to an embodiment of the present invention includes an interior insulation layer 110 located at the center portion of the flexible printed circuit 100, respective first and second conductive layers 120 and 140 respectively located at the upper and lower sides of the interior insulation layer 110 in circuit patterns, a first exterior insulation layer 125 deposited to cover the upper side surface of the interior insulation layer 110 and the first conductive layer 120, and a second exterior insulation layer 145 deposited to cover the lower side surface of the interior insulation layer 110 and the second conductive layer 140.

The insulation layers 110, 125, and 145 are formed by the deposition of photosensitive polyimide unlike the conventional technology. In the insulation layers 110, 125, and 145 formed of photosensitive polyimide, a desired particular portion can be accurately removed by masking, photo exposure, and developing according to photolithography. Thus, according to the present embodiment, a product defective rate can be reduced compared to the conventional technology in which the flexible printed circuit is manufactured by removing a particular portion from the insulation layers 110, 125, and 145 in a mechanical method such as punching. Also, since the insulation layers 110, 125, and 145 are formed by deposition, the thickness of the layer is thinner than that of the conventional insulation layers 31 and 32 shown in FIG. 2 in a film shape and the stiffness of the layer decreases. Therefore, the stiffness of the flexible printed circuit 100 decreases.

Figure 2:
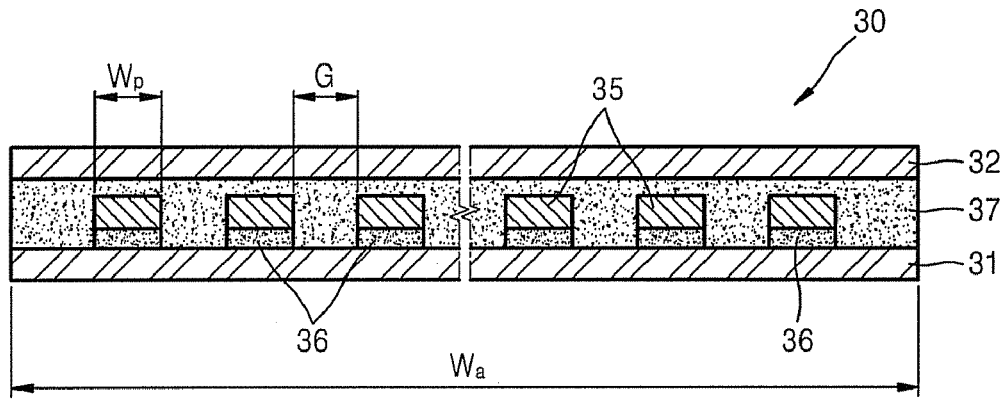
FIG. 2 is a cross-sectional view taken along line II-II of FIG. 1.

The conductive layers 120 and 140 are formed of conductive metal, for example, copper (Cu) or a copper alloy. The conductive metal is deposited in a circuit pattern by plating or deposition. The plating may be electro plating or electroless plating. For the sake of comparison, when it is assumed that the number of lines in the circuit pattern of the conductive layer 35 of the conventional flexible printed circuit 30 of FIG. 2 is the same as that of lines in the circuit pattern formed of the conductive layers 120 and 140, the width Wb of the flexible printed circuit 100 having the conductive layers 120 and 140 in a double layer structure is reduced to about half of the width W1 of the conventional flexible printed circuit 30 having a single layer structure.

Figure 4:
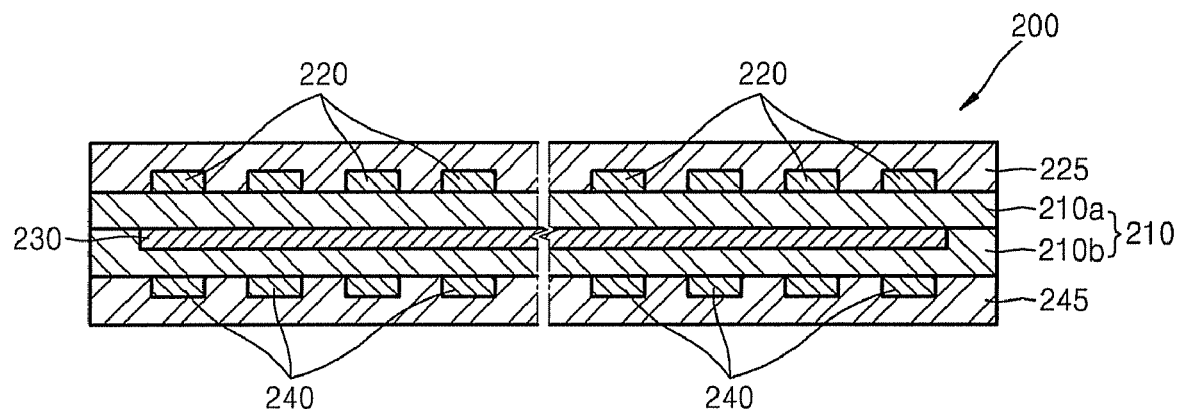

Referring to FIG. 4, a flexible printed circuit 200 according to another embodiment of the present invention includes an interior insulation layer 210 located at the center portion of the flexible printed circuit 200, first and second conductive layers 220 and 240 respectively located at the upper and lower sides of the interior insulation layer 210 in circuit patterns, a first exterior insulation layer 225 deposited to cover the upper side surface of the interior insulation layer 210 and the first conductive layer 220, and a second exterior insulation layer 245 deposited to cover the lower side surface of the interior insulation layer 210 and the second conductive layer 240.

In the present embodiment, however, the interior insulation layer 210 has a double layer structure of a first interior insulation layer 210a at the upper side and a second interior insulation layer 210b at the lower side. The flexible printed circuit 200 further includes an electromagnetic shield layer 230 between the first and second interior insulation layers 210a and 210b. When an electric signal of a high frequency wave is transmitted through an arbitrary circuit line formed in the first conductive layer 220 or the second conductive layer 240, an electromagnetic wave is generated so that electromagnetic interference (EMI) is generated in a circuit line of an adjacent conductive layer. The electromagnetic shield layer 230 restricts the EMI.

In the present embodiment, the electromagnetic shield layer 230 may include low carbon steel as an electromagnetic shield material. The electromagnetic shield material can include stainless steel, aluminum (Al), or an alloy of aluminum and iron (Fe), like the material for the actuator 17 of FIG. 1. The electromagnetic shield layer 230 can be formed by pasting a mixture of the above-described electromagnetic shield material powder and pigment or depositing the electromagnetic shield material. Since the electromagnetic shield layer 230 formed in one of the above methods is thin and has a weak stiffness compared to the electromagnetic shield layer in the shape of a metal thin plate, the stiffness of the flexible printed circuit 200 can be reduced. Also, the impendence of the conductive layers 220 and 240 can be reduced by the electromagnetic shield layer 230 which includes an electromagnetic shield metal material and is arranged close to the conductive layers 220 and 240.

Figure 5:
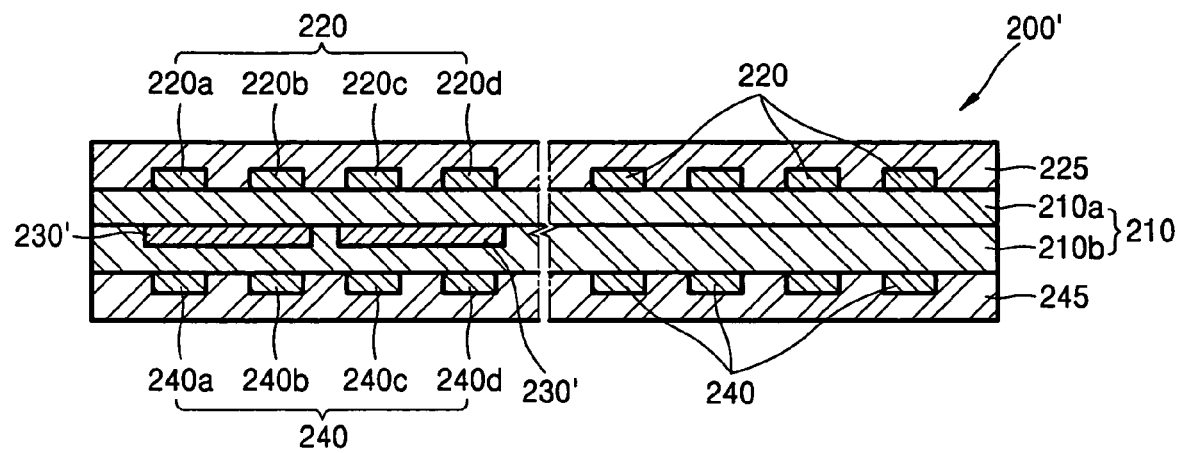
FIG. 5 is a cross-sectional view of a modification of the flexible printed circuit of FIG. 4.

FIG. 5 is a cross-sectional view of a modification of the flexible printed circuit of FIG. 4. Referring to FIG. 5, in a flexible printed circuit 200' according to a modification of the embodiment shown in FIG. 4, the electromagnetic shield layer 230 is formed between only the circuit patterns selected among the circuit patterns of the first and second conductive layers 220 and 240. The selected circuit patterns may include two pairs of circuit lines 220a and 220b, and 240a and 240b, for transmitting write signals to a magnetic head (not shown) provided at an end of an actuator, and two pairs of circuit lines 220c and 220d, and 240c and 240d, for transmitting read signals from the magnetic head. Since the circuit lines 220a through 220d, and 240a through 240d, are for transmitting relatively high frequency electric signals compared to the other circuit lines formed of the conductive layers 220 and 240, a possibility of malfunction of the hard disk drive due to the EMI is relatively great.

The methods of manufacturing the flexible printed circuit 100 and the flexible printed circuit 200 according to the above-described embodiments with reference to FIGS. 3 and 4 are described below in order.

Figure 6A:
FIGS. 6A through 6H are cross-sectional views sequentially showing the manufacturing process of the flexible printed circuit of FIG. 3.

FIGS. 6A through 6H are cross-sectional views sequentially showing the manufacturing process of the flexible printed circuit 100 of FIG. 3. Referring to FIG. 6A, the interior insulation layer 110 is deposited on a base layer 101 to form the flexible printed circuit 100. As described above with reference to FIG. 3, the interior insulation layer 110 can be formed by depositing photosensitive polyimide. A material exhibiting a superior deposition feature with the photosensitive polyimide and capable of being easily removed by etching is used for the base layer 101. A polyimide film can be used as a material for the base layer 101 or a metal material exhibiting an electromagnetic shield feature, that is, a thin plate formed of stainless steel, aluminum, an aluminum alloy, copper, or a copper alloy, can be used therefor. When stainless steel, for example, is used for the base layer 101, the thickness of a stainless steel thin plate is preferably about 50 µm because it can be quickly removed by etching and can firmly support the interior insulation layer 110.

Since the interior insulation layer 110 deposited on the base layer 101 is formed of photosensitive polyimide, an unnecessary portion can be accurately removed by masking, photo exposure, and developing according to photolithography. A film 115 formed of chromium (Cr) and copper (Cu) is formed on the interior insulation layer 110 by sputtering to improve a surface reaction property for the formation of the first conductive layer 120 (please refer to FIG. 6C).

Figure 6B:
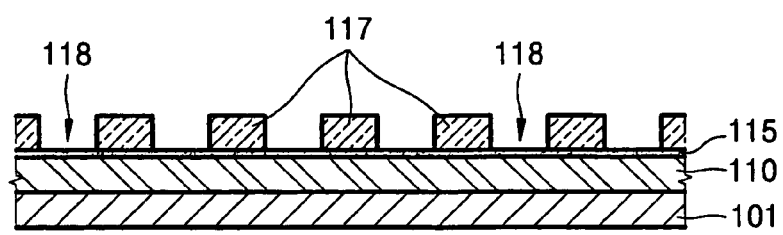
Figure 6C:
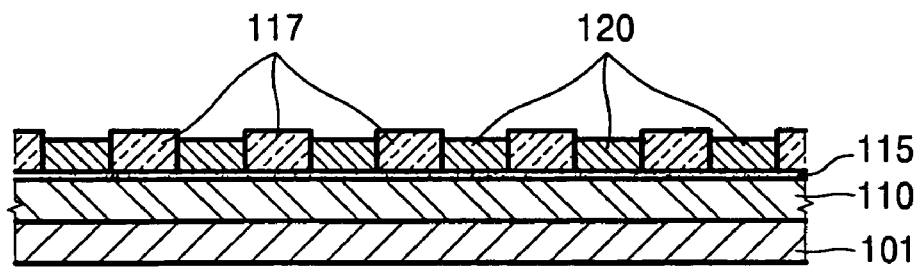
Figure 6D:
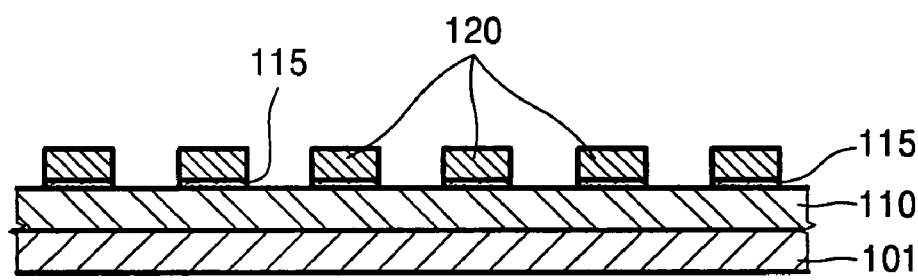

Next, the first conductive layer 120 having a circuit pattern shape is formed on the upper surface of the interior insulation layer 110 where the chromium and copper film 115 is formed. To form the first conductive layer 120, a photoresist layer 117 having a groove 118 corresponding to the circuit pattern as shown in FIG. 6B is formed on the upper surface of the interior layer 110. The photoresist layer 117 is formed in a typical photolithography by coating photoresist, forming a mask corresponding to the circuit pattern thereon, and performing photo exposure and developing. As shown in FIG. 6C, the first conductive layer 120 is deposited on the groove 118 corresponding to the circuit pattern and the photoresist layer 117 is removed as shown in FIG. 6D. The exposed chromium and copper film 115 is removed by etching. As described above with reference to FIG. 3, the first conductive layer 120 is deposited on the interior insulation layer 110 by plating or depositing a conductive metal, such as, for example, copper or a copper alloy. The size of the deposited first conductive layer 120 is accurately corrected and burr is removed by etching. The chromium and copper film 115 exposed by the photoresist layer 117 removed in the above etching process is removed together.

Figure 6E:
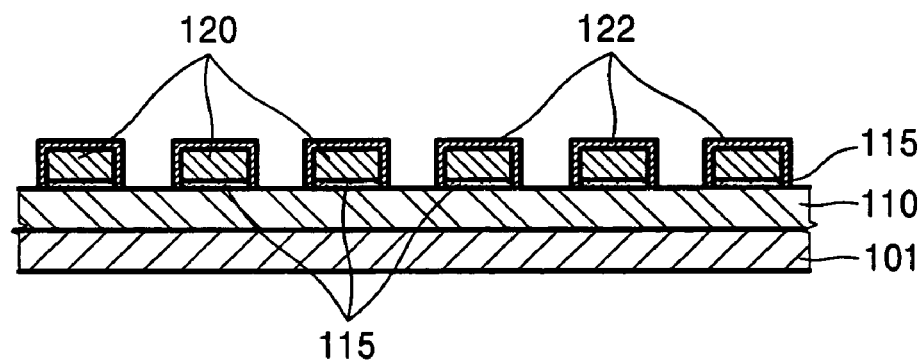

A nickel (Ni) plated layer 122 is formed on the first conductive layer 120, as shown in FIG. 6E. The plating may be electro plating or electroless plating. The nickel plated layer 122 prevents oxidation of the first conductive layer 120.

Figure 6F:
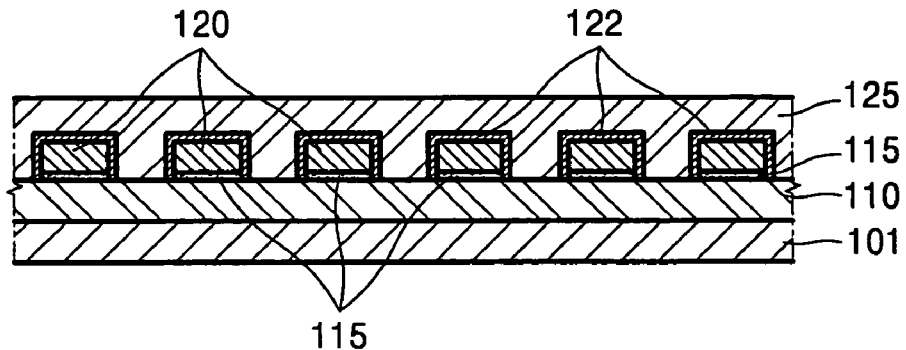
Figure 6G:
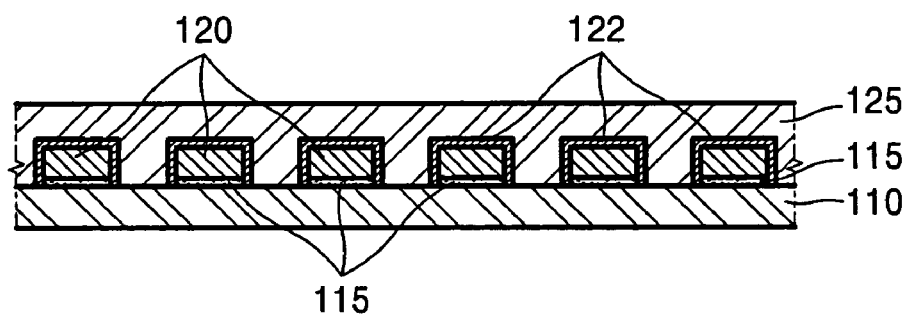

Referring to FIG. 6F, the first exterior insulation layer 125 is deposited to cover the upper surface of the interior insulation layer 110 and the first conductive layer 120. The first exterior insulation layer 125 can be formed by depositing photosensitive polyimide as in the case of the interior insulation layer 110. The base layer 101 is entirely removed by etching as shown in FIG. 6G so that the lower surface of the interior insulation layer 110 is exposed.

Figure 6H:
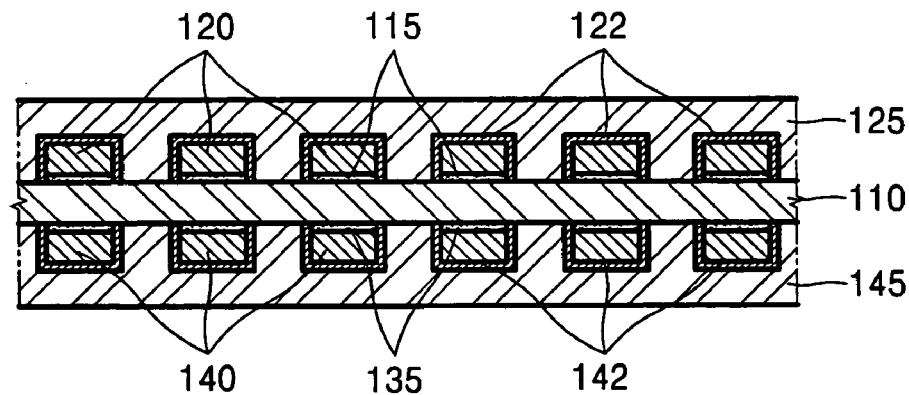

Referring to FIG. 6H, a chromium and copper film 135 is formed on the lower surface of the interior insulation layer 110. The second conductive layer 140 is formed and a nickel plated layer 142 is formed to prevent oxidation of the second conductive layer 140. The second exterior insulation layer 145 is deposited to cover the lower surface of the interior insulation layer 110 and the second conductive layer 140 so that the flexible printed circuit 100 having the conductive layers 120 and 140 of a double layer structure is completed.

Since the process of forming the second conductive layer 140 on the lower surface of the interior insulation layer 110 and depositing the second exterior insulation layer 145 thereon is the same as that of forming the first conductive layer 120 and the first exterior insulation layer 125, a detailed description thereof will be omitted herein. Meanwhile, the chromium and copper films 115 and 135 and the nickel plated layers 122 and 142 shown in FIG. 6H are not shown in FIG. 3 because these films and layers are small compared to other layers 110, 120, 125, 140, and 145.

Figure 7A:
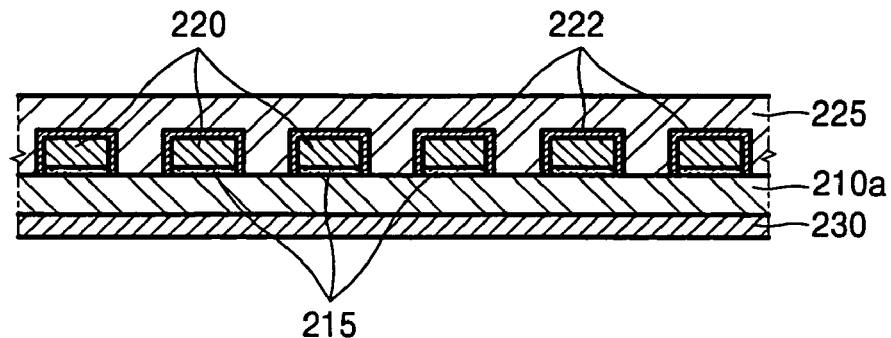
FIGS. 7A through 7C are cross-sectional views sequentially showing the manufacturing process of the flexible printed circuit of FIG. 4.
Figure 7B:
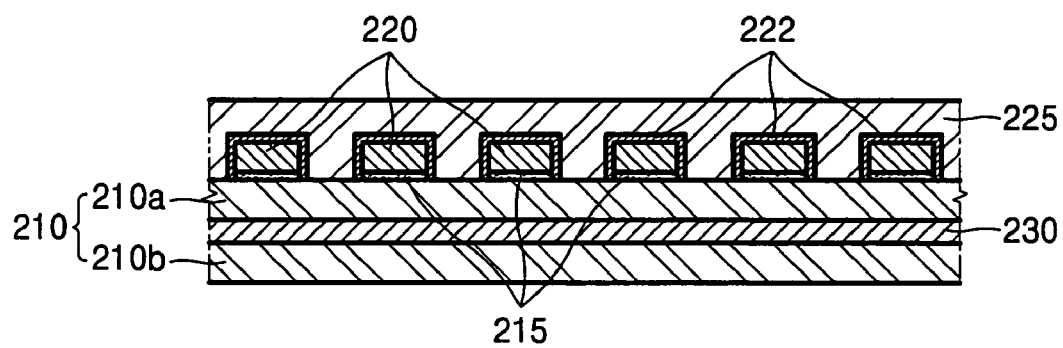
Figure 7C:
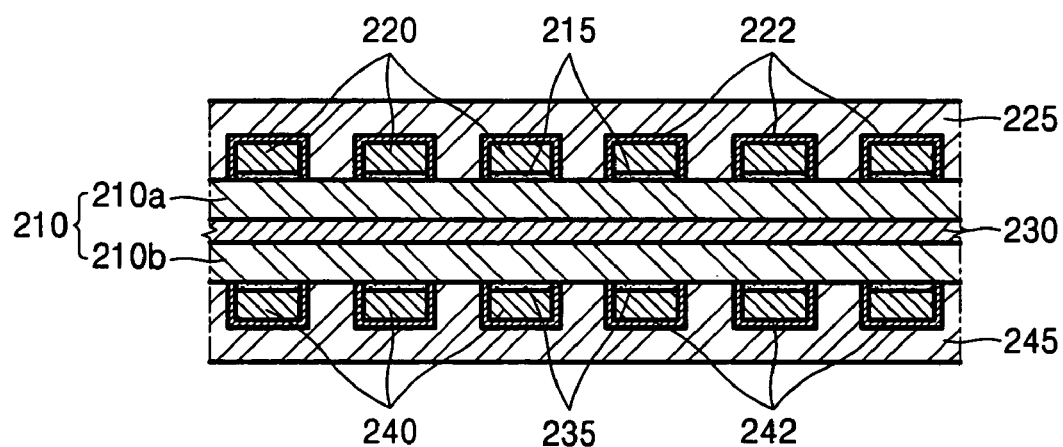

FIGS. 7A through 7C are cross-sectional views sequentially showing the manufacturing process of the flexible printed circuit of FIG. 4. The same process as shown in FIGS. 6A through 6G is performed in manufacturing the flexible printed circuit 200 shown in FIG. 4. Referring to FIG. 7A, through the above-described process, the first interior insulation layer 210a, the chromium and copper film 215, the first conductive layer 220, the nickel plated layer 222, and the first exterior insulation layer 225. The electromagnetic shield layer 230 is formed on the lower surface of the first interior insulation layer 210a. As shown in FIG. 4, the electromagnetic shield layer 230 can be formed by depositing an electromagnetic shield material or pasting a mixture of electromagnetic shield material powder such as low carbon steel, stainless steel, aluminum (Al), or an alloy of aluminum and iron (Fe) and pigment. Since the electromagnetic shield layer 230 formed in the above method is thin and exhibits a low stiffness compared to the electromagnetic shield layer in a metal thin plate, the stiffness of the flexible printed circuit 200 decreases.

Next, as shown in FIG. 7B, the second interior insulation layer 210b is deposited to cover the electromagnetic shield layer 230. The interior insulation layer 210 has a double layer structure including the first interior insulation layer 210a and the second interior insulation layer 210b. The second interior insulation layer 210b can be formed by depositing photosensitive polyimide like the first interior insulation layer 210a.

Next, as shown in FIG. 7C, the chromium and copper film 235 is formed on the lower surface of the second interior insulation layer 210b. The second conductive layer 240 is formed and a nickel plated layer 242 is formed to prevent oxidation of the second conductive layer 240. The second exterior insulation layer 245 is deposited to cover the lower surface of the second exterior insulation layer 245 and the second conductive layer. Thus, the flexible printed circuit 200 having the conductive layers 220 and 240 of a dual layer structure is completed. Since the process of forming the second conductive layer 240 on the lower surface of the second interior insulation layer 210b and depositing the second exterior insulation layer 245 thereon is the same as that of forming the first conductive layer 220 and the first exterior insulation layer 225, a detailed description thereof will be omitted herein. Meanwhile, the chromium and copper films 215 and 235 and the nickel plated layers 222 and 242 shown in FIG. 7C are not shown and omitted in FIG. 4 because these films and layers are so tiny compared to other layers 210, 220, 225, 230, 240, and 245.

Figure 8A:
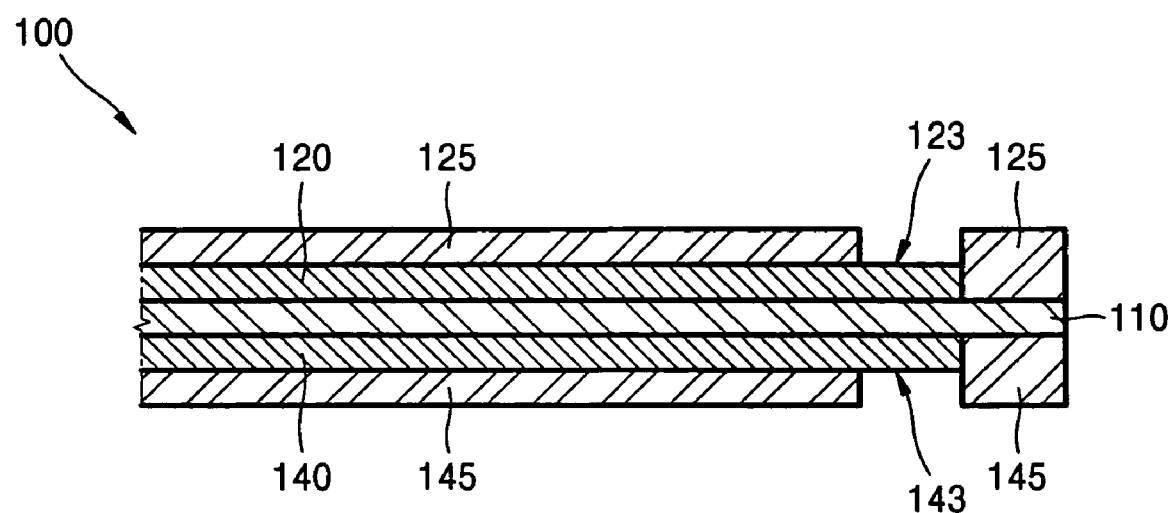
FIGS. 8A and 8B are cross-sectional views showing a process of forming a connecting pad on the flexible printed circuit of FIG. 3.
Figure 8B:
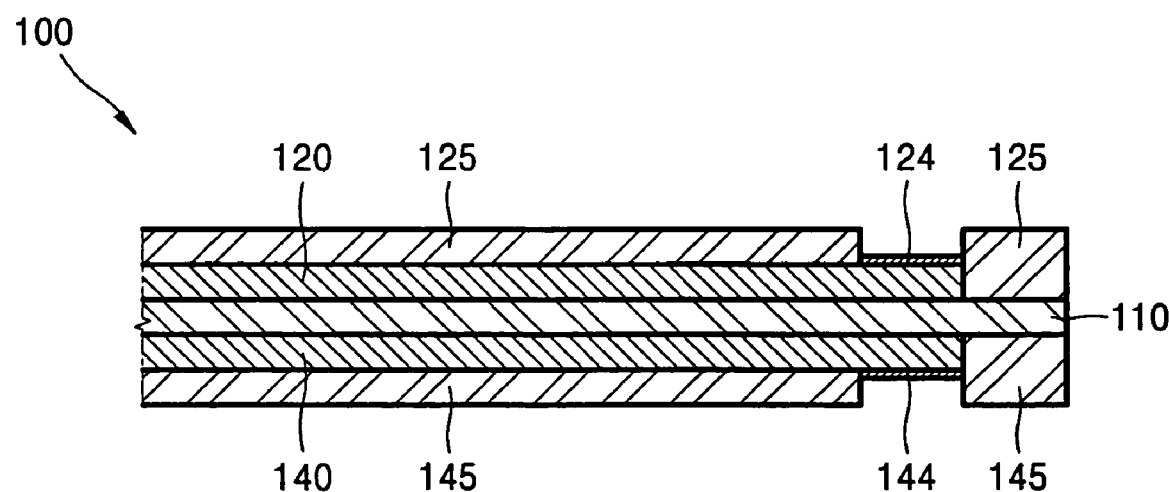

FIGS. 8A and 8B are cross-sectional views showing a process of forming a connecting pad on the flexible printed circuit 100 of FIG. 3. Referring to FIG. 8A, to connect the first conductive layer 120 and the second conductive layer 140 to a circuit device (not shown), for example, a semiconductor chip, connecting pads 123 and 143 are formed by partially removing the first exterior insulation layer 125 and/or the second exterior insulation layer 145 to expose the conductive layers 120 and 140. as shown in FIG. 8B, plated layers 124 and 144 are formed on the exposed connecting pads 123 and 143. The plated layers 124 and 144 are formed by sequentially plating nickel (Ni) and gold (Au). The nickel plating is to prevent oxidation of the conductive layers 120 and 140 and the gold plating is to prevent a so-called whiskering phenomenon which causes short circuit as solder grows after soldering of the circuit device. The subsequent process can be applied to the flexible printed circuit 200 of FIG. 4.

The stiffness of the flexible printed circuit according to the above-described embodiments of the present invention is lower than that of the conventional flexible printed circuit. Thus, since a hard disk drive adopting the present flexible printed circuit can drive the actuator with a small amount of electric power, the power consumption of the hard disk drive can be reduced.

Also, since the present flexible printed circuit does not include the adhesive layer, the change in stiffness according to the change in temperature is small so that the control of driving the actuator is reliable. Thus, the information process speed of the hard disk drive becomes faster.

Furthermore, since the present flexible printed circuit has a conductive layer of a double layer structure, the width of the flexible printed circuit is narrow compared to the conventional flexible printed circuit so that the miniaturization of the hard disk drive is available.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

What is claimed is:

1. A flexible printed circuit comprising:
   an interior insulation layer;
   a first conductive layer formed on a surface of the interior insulation layer in a circuit pattern;
   a first exterior insulation layer covering the surface of the interior insulation layer and the first conductive layer;
   a second conductive layer formed on another surface of the interior insulation layer in a circuit pattern; and
   a second exterior insulation layer covering the other surface of the interior insulation layer and the second conductive layer,
   wherein the interior insulation layer includes a first interior insulation layer and a second interior insulation layer and an electromagnetic shield layer between the first and second interior insulation layers.

2. The flexible printed circuit as claimed in claim 1, wherein no adhesive layer is provided between adjacent layers.

3. The flexible printed circuit as claimed in claim 1, wherein the insulation layer is formed of photoresist polyimide.

4. The flexible printed circuit as claimed in claim 1, wherein the insulation layers are formed by deposition.

5. The flexible printed circuit as claimed in claim 1, wherein the conductive layers are formed of copper or a copper alloy.

6. The flexible printed circuit as claimed in claim 1, wherein the conductive layers are formed by plating or deposition.

7. The flexible printed circuit as claimed in claim 1, wherein the electromagnetic shield layer includes low carbon steel as an electromagnetic shield material.

8. The flexible printed circuit as claimed in claim 1, wherein the electromagnetic shield layer includes aluminum (Al), or an alloy of aluminum (Al) and iron (Fe) as an electromagnetic shield material.

9. The flexible printed circuit as claimed in claim 1, wherein the electromagnetic shield layer is formed by pasting a mixture of electromagnetic shield material powder and pigment.

10. The flexible printed circuit as claimed in claim 1, wherein the electromagnetic shield layer is formed by deposition.

11. The flexible printed circuit as claimed in claim 1, wherein the electromagnetic shield layer is formed between selected parts of circuit patterns of the first and second conductive layers.

12. The flexible printed circuit as claimed in claim 1, further comprising a connecting pad which is formed by partially removing the first and second exterior insulation layers to expose the conductive layers so as to be connectable to other circuit device.

13. A flexible printed circuit comprising:
an interior insulation layer including a first interior insulation layer and a second interior insulation layer and an electromagnetic shield layer therebetween;
a first conductive layer formed on a surface of the first interior insulation layer in a circuit pattern;
a first exterior insulation layer covering the first interior insulation layer and the first conductive layer;
a second conductive layer formed on a surface of the second interior insulation layer in a circuit pattern; and
a second exterior insulation layer covering the second interior insulation layer and the second conductive layer.

14. The flexible printed circuit as claimed in claim 13, wherein the electromagnetic shield layer is formed between only some of the circuit patterns of the first and second conductive layers.

15. The flexible printed circuit as claimed in claim 13, wherein the some circuit patterns include two pairs of circuit lines transmitting write signals to a magnetic head, and two pairs of circuit lines transmitting read signals from the magnetic head.

\* \* \* \* \*